United States Patent [19]

Amemiya et al.

[11] Patent Number: 4,587,547
[45] Date of Patent: May 6, 1986

[54] ELECTRODE STRUCTURE FOR A SEMICONDUCTOR DEVICES

[75] Inventors: Yoshihito Amemiya, Fuchu; Takayuki Sugeta, Tokyo; Yoshihiko Mizushima, Fuchu, all of Japan

[73] Assignee: Nippon Telegraph & Telephone Public Corp., Tokyo, Japan

[21] Appl. No.: 512,942

[22] Filed: Jul. 12, 1983

Related U.S. Application Data

[63] Continuation of Ser. No. 125,284, Feb. 27, 1980, abandoned.

[30] Foreign Application Priority Data

May 7, 1979 [JP] Japan ................................ 54-55600
May 7, 1979 [JP] Japan ................................ 54-55601
Sep. 4, 1979 [JP] Japan ............................... 54-113216

[51] Int. Cl.⁴ ................... H01L 29/04; H01L 29/06; H01L 29/46; H01L 29/91
[52] U.S. Cl. ............................................. 357/59; 357/12; 357/20; 357/33; 357/86; 357/89; 148/DIG. 20; 148/DIG. 122; 148/DIG. 140
[58] Field of Search ................... 357/86, 89, 33, 20, 357/59, 12, 38

[56] References Cited

U.S. PATENT DOCUMENTS

| | | | |
|---|---|---|---|
| 3,217,212 | 11/1965 | Ryder | 357/86 |
| 3,395,320 | 7/1968 | Ansley | 357/86 |
| 3,497,776 | 2/1970 | Philips | 357/89 |
| 3,617,829 | 11/1971 | Lesk | 357/86 |
| 3,641,403 | 2/1972 | Nakata | 357/38 |
| 3,858,233 | 12/1974 | Miyata et al. | 357/86 |
| 3,918,082 | 11/1975 | Hutson | 357/86 |
| 4,074,303 | 2/1978 | Benda et al. | 357/33 |
| 4,156,246 | 5/1979 | Pedersen | 357/86 |

FOREIGN PATENT DOCUMENTS

2431011 1/1975 Fed. Rep. of Germany ........ 357/86

*Primary Examiner*—William D. Larkins
*Attorney, Agent, or Firm*—Thompson, Birch, Gauthier & Samuels

[57] ABSTRACT

An electrode structure for use in semiconductor devices comprising: a semiconductive layer; a conductive layer disposed on one surface of the semiconductive layer; first regions which intervene between the layers and serve as passages for transmitting minority carriers from the semiconductive layer to said conductive layer; and second regions which intervene between said layers and serve as passages for conveying majority carriers between the semiconductive layer and conductive layer, the first and second regions being selectively formed on the semiconductive layer so as to be adjacent to one another.

3 Claims, 18 Drawing Figures

ELECTRODE STRUCTURE FOR A SEMICONDUCTOR DEVICES

This is a continuation of application Ser. No. 125,284, filed Feb. 27, 1980 now abandoned.

BACKGROUND OF THE INVENTION

The present invention relates to the structure of electrodes for semiconductor devices.

In prior art semiconductor devices, the electrode structure has been designed and determined by considering the behavior of majority carriers, and not of minority carriers, which have a large influence on the characteristics of semiconductor devices. For instance, in the prior art P-N junction type semiconductor diodes (FIG. 1), the diode comprises a P+ semiconductor layer 11 with a high impurity concentration, a P− semiconductor region 12 having a low impurity concentration, an N+ semiconductor layer 13 containing N-type impurities at a high concentration value, and metal electrodes 14 and 15 which are formed to sandwich the structure constituted with these layers and a region.

Figure 1:
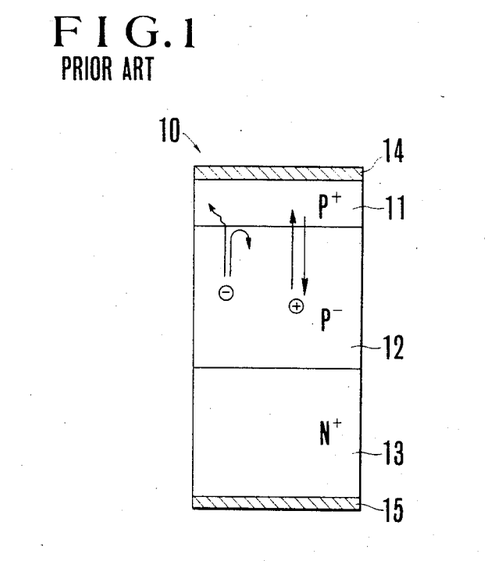
FIG. 1 is a schematic cross-sectional representation showing an example of the prior art electrode structure for use in semiconductor devices.
Figure 2:
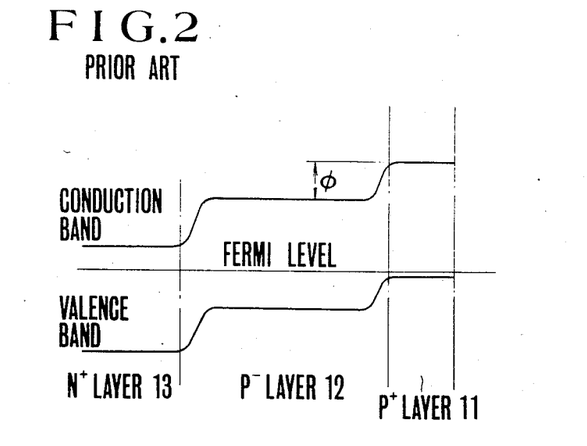
FIG. 2 is a diagrammatical representation for explaining the energy level throughout the structure of the semiconductor device in FIG. 1.

When a forward voltage is applied to the electrodes, majority carriers (holes in this case) can pass through said P− layer 12, P+ layer 11 and the metal electrode 14 by means of their free movement within the valence band. This is illustrated in FIG. 2. Minority carriers (electrons in this case), however, which are injected from the N+ layer 13 into the P− layer 12 and move from the P− layer 12 to the metal electrode 14, are usually reflected and accumulated by a potential barrier $\phi$ of a high-low junction created between the P− layer 12 and P+ layer 11, so that a current conduction is restricted in the prior art P-N diodes, resulting to a large forward voltage drop. Another disadvantage of the prior art P-N diodes is a low speed recovery, resulting from the minority carrier accumulation by the high-low junction. These phenomena have been already reported in the technical article entitled "On Carrier Accumulation, And The Properties Of Certain Semiconductor Junctions" written by J. B. Gunn for J. Electron Contr. (Vol. 4, pp 17–50, 1958).

In order to solve the problem above mentioned, it may be proposed to remove the P+ region 11. It is not practical, however, because the P− region 12 is required to have a low impurity concentration less than $10^{17}/cm^3$ in order to obtain a sufficient reverse blocking voltage. In such a low impurity concentration, an extremely high contact resistance appears between the semiconductor and the metal electrode, resulting to a large forward voltage drop. In order to obviate such difficulty of the contact resistance, the P+ region 11 having the impurity concentration more than $1 \times 10^{18}/cm^3$ would be required as taught in the prior art.

For these reasons, the prior art semiconductor diode has a relatively large forward voltage drop, which results in a large power dissipation or loss. Further, minority carriers are accumulated as mentioned above in the semiconductor layer 12, thereby a reverse recovery time constant being enlarged and a reverse recovery being delayed.

Difficulty like the above is concerned not only with the electrode structure of the diodes, but also with that of other semiconductor devices such as thyristors, transistors and so forth.

SUMMARY OF THE INVENTION

Accordingly, a main object of the present invention is to provide an electrode structure for semiconductor devices, the semiconductor devices having low loss.

Another object of the invention is to provide an electrode structure for semiconductor devices, the semiconductor devices being capable of performing a high speed operation.

In order to achieve the objects above, there is provided an electrode structure for semiconductor devices according to the present invention, which comprises a semiconductor layer, a conductive layer disposed on one surface of the semiconductor layer, first regions which intervene between the layers and act as passages for minority carriers moving from the semiconductor layer to the conductive layer, and second regions which intervene between the layers so as to constitute passages for majority carriers between the semiconductor layer and the conductive layer, the first and second regions being adjacent to each other and being selectively formed on the semiconductor layer.

With the electrode structure as mentioned above, the passages for minority carriers are formed between the conductive layer and the semiconductor layer, the passages for the minority carriers being adjacent to the passages for majority carriers. Therefore, no potential barrier for minority and majority carriers is formed between said layers, so that free movement of minority and majority carriers is not restricted at all. At the same time, the electrode structure can efficiently absorb minority carriers out of the semiconductor layer.

The invention will be more fully understood from the following description taken by referring to the accompanying drawings.

DESCRIPTION OF THE PREFERRED EMBODIMENT

Figure 3:
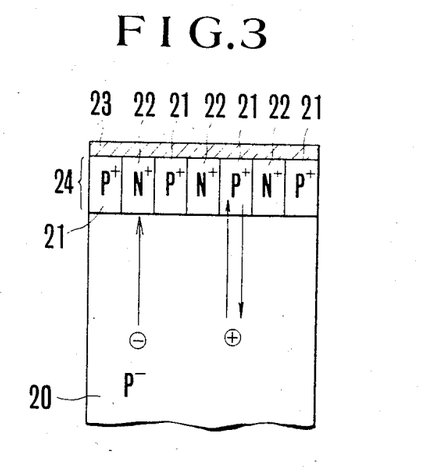
FIG. 3 is a cross-sectional view of the electrode structure embodying the present invention.

FIG. 3 shows one example of the electrode structure for semiconductor devices according to the present invention. In the figure, a reference numeral 20 designates a P⁻ semiconductor layer which contains P-type impurities or boron at the concentration of $10^{15}/cm^3$, On layer 20, there are provided small regions 21 and 22 of P⁺-type and N⁺-type which are arranged side by side to provide a repeat pattern region 24 of P⁺-N⁺. The region 21 contains P-type impurities or boron gallium to the extent that its surface impurity concentration is about $5 \times 10^{18}/cm^3$ and the region 22 contains N-type impurities or phosphorus or arsenic to the extent that its surface concentration becomes about $5 \times 10^{19}/cm^3$. Then, a conductive layer 23 made of a metal such as chromium, nickel, molybdenum, aluminum, and so forth, is formed on repeated P⁺-N⁺ pattern region 24.

According to the structure described above, the P⁺ region 21 plays a part in transferring majority carriers or holes from the conductive layer 23 to the semiconductor layer 20 or vice versa. This may be the same as the prior art structure. In the present structure, however, the N⁺ regions 22 intervening between two adjacent P⁺ regions 21 play a part in transmitting minority carries from the semiconductor layer 20 to the conductive layer 23.

Figure 4:
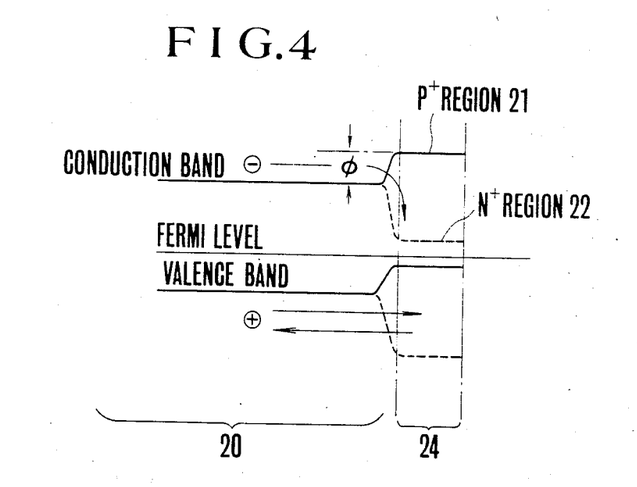
FIG. 4 is a diagrammatical expression of the energy level throughout the semiconductor device structure shown in FIG. 3.
Figure 5A:
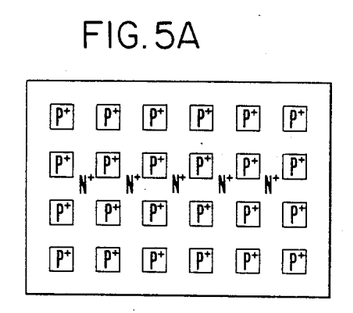
FIGS. 5A, 5B, 5C and 5d show examples of patterns of P+-N+ mosaic pattern layers.
Figure 5B:
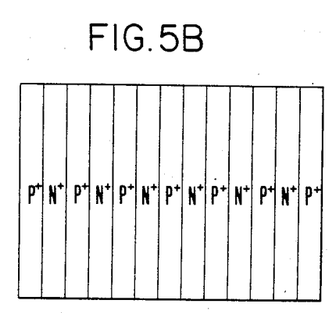
Figure 5C:
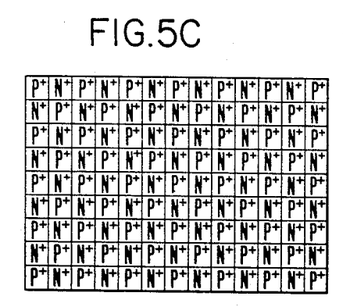
Figure 5D:
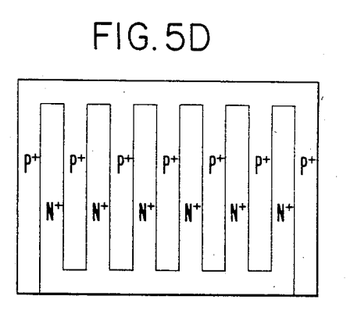

The electrode structure will be further explained in terms of energy level by using FIG. 4. It is entirely the same as the case of the prior art that majority carriers or holes can pass through the valence band via the course, conductive layer 23-P⁺ region 21-semiconductor layer 20 or the inverted. On one hand, minority carriers or electrons contained in the semiconductor layer 20 are on the conduction band of the P⁻ region. This is also the same as the case of the prior art. The conduction band of the P⁺ region 21 is at a higher energy level than P⁻ region, and a potential barrier φ is created therebetween. However, according to the present invention, N⁺ region 22 is formed to be adjacent to P⁺ region 21, and its conduction band comes to have a lower energy level than that of P⁻ region 20. Consequently, electrons on the conduction band of P⁻ region 20 can move to the lower conduction band level (dashed line) of the N⁺ region 22 and then reach the conductive layer 23. In other words, minority carries and majority carriers come to move through courses that have been allotted to them, respectively. Therefore, the movement of carriers is made more smooth, thereby the voltage drop of the device with such a structure is highly reduced to obviate unnecessary loss that has been inevitable in the prior art electrode structure. Further, according to the electrode structure of the present invention, the accumulation of minority carriers which has caused serious problems in the prior art devices is almost eliminated, thereby devices having such an electrode structure are satisfactorily operated at a sufficient high speed. Still further, it is worth noting that there is no specific demand for accuracy in forming the present P⁺-N⁺ mosaic pattern 24, because the mosaic pattern is required only for formation of passages for respective carriers.

Accordingly, there is no need to adopt accurate mask alignment, and a little defect of the pattern can be allowed in view of the present purpose.

FIGS. 5A through 5D show several examples of the mosaic pattern 24. It is apparent, in respective examples, that P⁺ regions and N⁺ regions are interchangeable. The area ratio of regions 21 and 22 are to be determined so as to achieve more smooth conduction of majority carriers and minority carriers. For instance, the following value range would be preferable, that is, $$\frac{\text{Total area of N}^+ \text{region 22}}{\text{Total area of P}^+ \text{region 21}} = 0.05 \text{ to } 50$$

In case of deciding the above area ratio, it is apparent that the impurity concentration in respective regions and the depth of regions as well must be taken into consideration.

Figure 6:
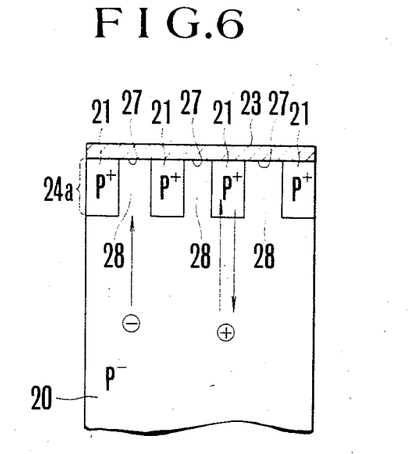
FIG. 6 is a cross-sectional view of another embodiment according to the present invention.

FIG. 6 shows another embodiment of the present invention. In the figure, what is different from FIG. 3 is that the passage for minority carriers from the P⁻ semiconductor layer 20 to the conductive layer 23 is formed by using a Schottky barrier region 27. In this structure, the P⁺ regions 21 are formed selectively on the P⁻ semiconductor layer 20 to make the passages for majority carriers between the semiconductor layer 20 and the conductive layer 23. Then, a metal layer as an electrode 23 is formed on P⁺ regions 21 and the remaining P⁻ portions 28 as well, by using such a metal as chromium, nickel, molybdenum, and aluminum. Consequently, the remaining portions 28 come to directly contact with metal conductive layer 23 through Schottky barriers 27 interveningly produced therebetween.

According to this structure, the passages for majority carriers between the semiconductor layer 20 and the conductive layer 23 are formed by P⁺ regions 21 which are doped at high concentration with the same type impurities as the semiconductor layer 20 whereas the passages for minority carriers are formed by Schottky barrier regions 27.

Figure 7:
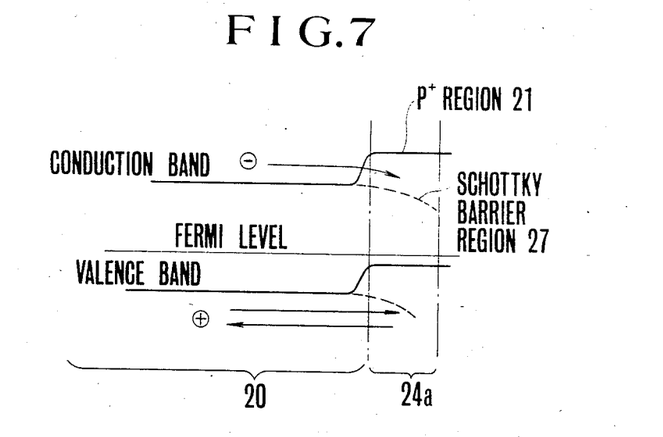
FIG. 7 is a diagrammatical representation of energy level throughout the semiconductor device structure shown in FIG. 6.

This will be more fully understood from the diagrammatical expression of the energy level (FIG. 7) throughout the structure as shown in FIG. 6. Majority carriers or holes pass through the valence band having no potential barrier in the same manner as mentioned with regard to the previous embodiment of this invention. Electrons, on one hand, which are on the conduction band of semiconductor layer 20, are introduced into the conductive layer 23 through Schottky barrier regions 27 which are slightly lower than the conduction band energy level of the semiconductor region 20. Concerning the mosaic pattern which is drawn by a plurality of P⁺ regions 21 and Schottky barrier regions 27 on the surface of the semiconductor region 20, it may be possible to use patterns that have been already illustrated in FIG. 5A through FIG. 5D, and the mosaic pattern 24a is obtained just by replacing N⁺ regions of those figures with Schottky regions 27.

As described already in connection with FIG. 3, according to the electrode structure as discussed above, the movement of majority carriers and minority carriers as well is made smooth to a great extent, so that the voltage drop of semiconductor devices having such an electrode structure is highly improved to decrease the loss of the devices. Further, with the electrode structure as mentioned above, it becomes possible to provide improved semiconductor devices in which accumulation of minority carriers is negligible, which is convenient for high speed operation. Still further, Schottky barrier regions utilized in this electrode structure are only for use in formation of passages for minority carriers, and they are not required to have a large reverse blocking voltage, so that they may be formed readily without any special formation procedure.

The electrode structure as has been discussed thus far is formed by the following steps.

Now, it is assumed that the semiconductor region on which the electrode structure is going to be constructed, has a conductive type of P−. The first step taken is to diffuse P-type impurities or boron or gallium onto the surface of the P− semiconductor region to form the diffused P+ regions having the impurity concentration of $1\times 10^{19}/cm^3$ and a depth of about 1 micron. The second step is to diffuse N-type impurities or phosphorus or arsenic selectively to form N+ regions having the impurity concentration of $1\times 10^{20}/cm^3$ and a depth deeper than the P+ regions, for example the depth of 1.2 microns. The third step is to deposit metal like aluminum on the entire surfafce of the P+-N+ mosaic pattern.

Beside the above formation process according to the present invention, the following steps may be used to obtain the same structure.

At first, N+ semiconductor layer is formed on the surface of P− semiconductor region by means of vapor phase epitaxy so as to have in it N-type impurities or phosphorus or arsenic at the concentration of $5\times 10^{18}/cm^3$ and the depth of about 1 micron. Then, P-type impurities or boron are selectively diffused into said epitaxially grown N+ layer to form P+ regions having the impurity concentration of $5\times 10^{19}/cm^3$ and the depth deeper than that of said N+ layer, for example the depth of 1.5 microns. After this step, metal deposition is performed over the entire surface where the P+-N+ mosaic pattern is produced.

Another method of forming the electrode structure of the present invention is possible and it comprises the steps of diffusing P-type impurities or boron selectively onto the surface of the P− semiconductor region to form the P+ regions with the impurity concentration of $5\times 10^{19}/cm^3$ and the depth of about 1 micron; performing ion implantation or diffusion of N-type impurity or phosphorus or arsenic onto the entire surface (including the P+ regions) to form N+ regions at the places other than those where P+ regions have been already formed, the N+ regions having the impurity concentration of $1\times 10^{19}/cm^3$ and a 0.5 micron depth; and forming a metal layer on the treated surface for forming an ohmic contact. In this case, N-type impurities are naturally implanted or diffused also into the P+ regions already formed, but it does not cause any trouble for the P+ regions because the impurity concentration of the P+ regions is made sufficiently higher against the concentration of N-type impurities implanted or diffused.

Still another method of forming the electrode structure of the present invention is possible and it comprises the steps of diffusing P-type impurities or boron selectively onto the surface of the P− region to form P+ regions which contain the impurity concentration of $5\times 10^{19}/cm^3$ and have the depth of about 1 micron; and forming a metal or nickel layer on the surface to make an ohmic contact to the P+ regions and a Schottky contact to the remaining P− surface.

Figure 8:
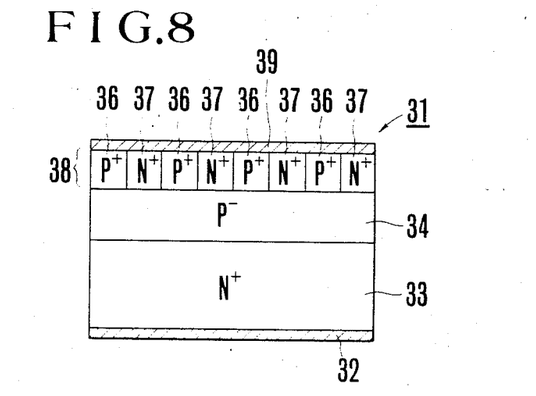
FIG. 8 is a cross-sectional view of the P-N junction type semiconductor diode embodying the present invention.

Now, there will be described the application of the invention to various semiconductor devices. FIG. 8 is illustrating the cross-sectional view of the P-N junction type rectifying diode to which the present invention is applied. In the figure, a reference numeral 31 designates the diode which comprises a N-type semiconductor substrate 33 having the antimony concentration of $5\times 10^{18}/cm^3$ (resistivity of 0.01 ohm·cm) and the thickness of about 300 microns, and contacting with a nickel electrode 32 at its one surface; a P− semiconductor layer 34, which is deposited on the other surface of substrate 33 by means of vapor phase epitaxy process, contains the boron of $5\times 10^{15}/cm^3$ and has the thickness of about 10 microns; a mosaic pattern layer 38 which formed in contact with the other surface of semiconductor layer 34 includes diffused P+ regions 36 having the surface boron concentration of $5\times 10^{18}/cm^3$ and the depth of 1 micron and diffused N+ regions 37 having the surface phosphorus concentration of $5\times 10^{20}/cm^3$ and the thickness of 1 micron; and another nickel layer 39 which is in contact with mosaic pattern layer 38.

Figure 9:
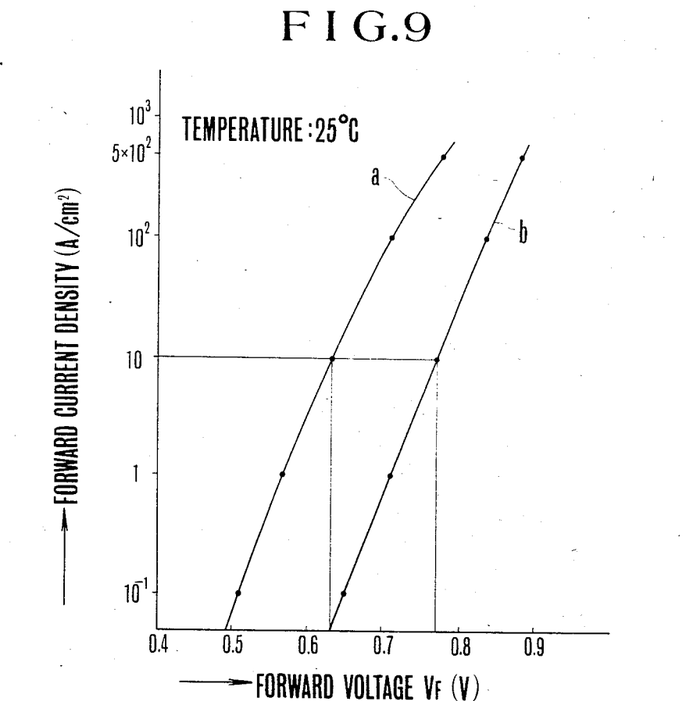
FIG. 9 is a graph for explaining forward voltage vs forward current density characteristics of the diode shown in FIG. 8.
Figure 10:
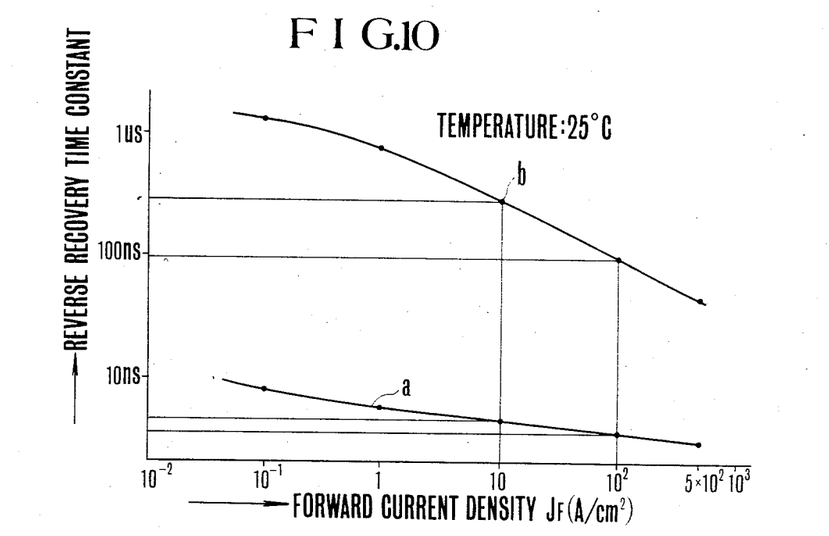
FIG. 10 is a graph for explaining forward current density vs recovery time constant characteristics of the diode as shown in FIG. 8.

FIGS. 9 and 10 show the forward voltage vs forward current density characteristics and the forward current density vs reverse recovery time constant characteristics of the diode having the structure as mentioned above. These characteristics have been observed at the temperature of 25° C. In the graphs of FIGS. 9 and 10, the line b represents the corresponding characteristics of the prior art diode, which has the same construction as the diode 31 except that the mosaic pattern layer 38 is replaced by the diffused P+ layer having the boron concentration of $5\times 10^{18}/cm^3$ and the depth of 1 micron. From the comparison of the characteristics represented by lines a and b, it will be understood that the forward drop $V_F$ at the forward current density 10 A/cm² is about 0.63 volt for the diode according to the present invention and is about 0.78 volt for the prior art diode. When the current density is 100 A/cm², the forward voltage drop of the diode by the present invention is about 0.71 volt while it becomes about 0.83 volt for the prior art. As apparently seen from this characteristics difference, the diode 31 made according to the present invention brings the remarkable advantage that the forward voltage drop is lowered to a great extent against a certain current density when compared to the prior art diode, thus resulting in lowered loss. Further, it would be understood from the diode characteristics represented by lines a and b in FIG. 10 that the reverse recovery time constant tr for the forward current density 10 A/cm² is about 4.5 nS in case of the diode 31 whereas it is about 290 nS in the prior art. Further, when the current density is 100 A/cm², the time constant of the diode 31 is about 3.5 nS while that of the prior art is about 95 nS.

From the results above, it is definitely determined that the reverse recovery time tr of the diode by the invention is made extremely smaller than that of the prior art diode. From this fact, it is determined that the storage charge in the diode is made remarkably smaller. This means that the diode of the present invention can comply with the demand of high speed operation to a greater extent than the prior art diode.

Figure 11:
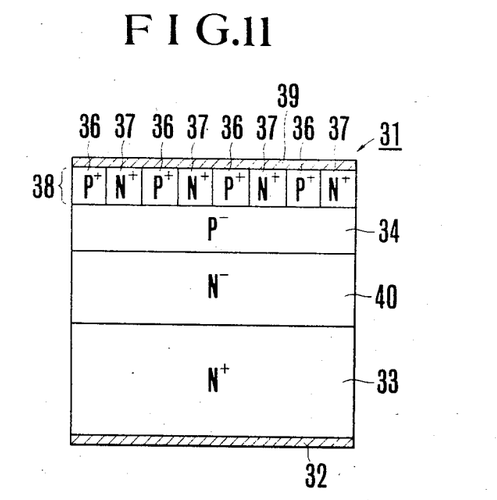
FIG. 11 is a cross-sectional view of a P-i-N junction diode to which the present invention is applied.

FIG. 11 shows another application of the invention to a diode having a P-i-N structure. What is different from the application in FIG. 8 is that there is provided between P− semiconductor layer 34 and N+ semiconductor layer 33, and N− semiconductor layer 40 which has a high resistivity and is adapted to improve the reverse voltage of the diode. Accordingly, the same effect and advantage as obtained in the case of FIG. 8 are equally obtainable in this application. In FIG. 11, the N+ regions 37 can be replaced with the Schottky barrier regions, as shown in FIG. 6.

Figure 12:
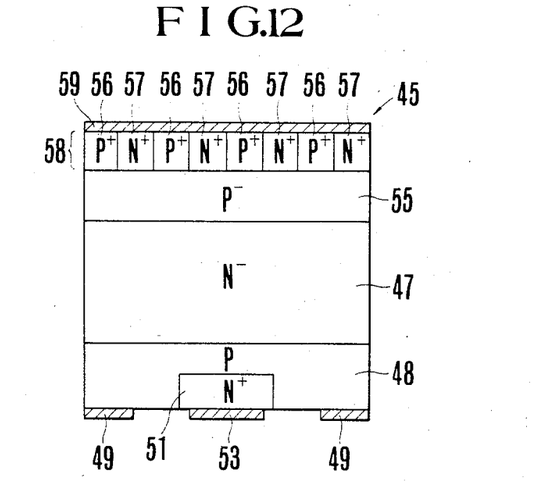
FIG. 12 is a cross-sectional view of a PNPN thyristor to which the present invention is applied.

FIG. 12 shows a cross-sectional view of the PNPN type thyristor to which the present invention is applied. The PNPN type thyristor is a 3-port semiconductor device and is widely utilized for the purpose of electronic control, so that minimization of its loss and improvement of its switching speed as well have been continuously demanded. In FIG. 12, a reference numeral 45 denotes the entirety of a thyristor which comprises an N$^-$ semiconductor layer 47 having the impurity concentration of $5 \times 10^{14}/cm^3$ and the thickness of about 50 microns; a P-type semiconductor layer 48 which is formed on one surface of N$^-$ layer 47, layer 48 having the surface impurity concentration of $5 \times 10^{18}/cm^3$ and the depth of about 10 microns and being used as a gate region, a gate electrode 49 which is formed on the surface of P-type layer 48; an N+ semiconductor region 51 which is formed on the surface where the gate electrode 49 is formed, region 51 having the surface impurity concentration of $2 \times 10^{19}/cm^3$ and the depth of about 5 microns and being used as a cathode region; a cathode electrode 53 formed on the surface of N+ layer 51; a P$^-$ semiconductor region 55 which is formed on the other surface of N$^-$ layer 47, region 55 having the impurity concentration of $4 \times 10^{16}/cm^3$ and the thickness of about 5 microns and being used as an anode region; a mosaic pattern layer 58 of about 2 microns thickness includes a plurality of P+ regions 56 and N+ regions 57 formed on layer 55, P+ regions and N+ regions having the impurity concentration of $1 \times 10^{19}/cm^3$ and $5 \times 10^{19}/cm^3$ respectively; and another electrode 59 overlying mosaic pattern layer 58.

When the thyristor 45 as constructed above was studied in comparison with the prior art thyristor, the following results were obtained (Table I). In this case, the prior art thyristor has the same construction as the thyristor 45 with the exception that the mosaic pattern layer 58 is replaced by a P+ region.

TABLE I

|  | $V_F$ | tr |
| --- | --- | --- |
| Thyrister 45 | 0.89 | 0.086 |
| Prior art thyristor | 1 | 1 |

(note)
1. Values for the thyristor 45 are relative when the value for prior art thyrister is made 1.
2. Measurement was made at the current density 100 A/cm$^2$ As will be understood from the Table I, it is apparent that the thyristor to which the invention is applied is highly improved in its loss and its high speed switching operation as well.

Figure 13:
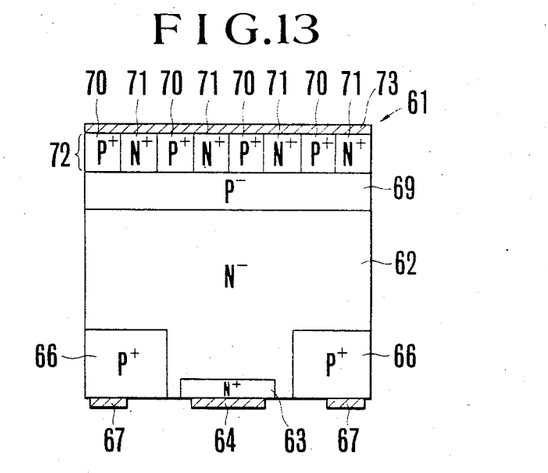
FIG. 13 is a cross-sectional view of a static induction thyristor to which the present invention is applied.

FIG. 13 shows the case in which the present invention is applied to a static induction type thyristor 61. This device is a field controlled thyristor which is provided with various attractive natures. For instance, it is capable of performing gate turn off and presenting a switching action faster than that of a prior art ordinary thyristor, and further it has a small forward voltage drop, large di/dt and dv/dt capabilities, and still further it can be satisfactorily operated under a high temperature condition. As shown in FIG. 13, the thyristor 61 has an N+ semiconductor region 63 which is formed on the one surface of an N$^-$ semiconductor layer 62 having the impurity concentration of $5 \times 10^{14}/cm^3$ and the thickness of about 60 microns. The region 63 has the surface impurity concentration of $2 \times 10^{19}/cm^3$ and the thickness of 2 microns and is used as a cathode region, on which a cathode electrode 64 is formed. Thyristor 61 further includes a P+ semiconductor region 66 which is formed as a gate region on the surface of N$^-$ layer 62 surrounding N+ region 63, and which has the surface impurity concentration of $5 \times 10^{18}/cm^3$ and the depth of 10 microns. This region 66 is provided with a gate electrode 67 formed thereon. The thyristor 61 is further provided with a P$^-$ semiconductor layer 69 which is formed on the other surface of N$^-$ layer 62 so as to have the impurity concentration of $4 \times 10^{16}/cm^3$ and the thickness of about 5 microns. On layer 69 there is provided a mosaic pattern layer 72 which consists of a plurality of P+ regions 70 and N+ regions 71 and has a thickness of about 2 microns, the P+ regions and N+ regions having the impurity concentration of $1 \times 10^{19}/cm^3$ and $5 \times 10^{19}/cm^3$, respectively. Further, the thyristor 61 has an anode electrode 73 which overlies the upper surface of mosaic pattern layer 72.

The thyristor 61 as constructed above according to the present invention was studied in comparison with the prior art thyristor. As a result, the following data were obtained in respect of the forward voltage drop $V_F$ and the reverse recovery time constant tr. The condition taken in the comparative study is same as that in case or FIG. 12. That is, the current density is 100 A/cm$^2$. The values shown in Table II are relative values when the value for the prior art thyristor is regarded as 1.

TABLE II

|  | $V_F$ | tr |
| --- | --- | --- |
| Thyristor 61 | 0.88 | 0.095 |
| Prior art thyristor | 1 | 1 |

From the above table, it can be readily seen that the static conduction type thyristor to which the present invention is applied is highly improved in minimizing its loss and achieving high speed switching operation.

In several applications of the present invention as have been discussed in the foregoing paragraphs, the mosaic pattern layer adopted by each device is same as that shown in FIG. 3. It is apparent, however, that the other mosaic pattern layers may be used in the applications explained so far. It is possible, for instance, to adopt the mosaic pattern layer consisting of P+ regions and Schottky barrier regions, as shown in FIG. 6.

Further, in the description as to the embodiment as shown in FIG. 3, it is stated that the conductive layer 23 is made of a metal. It is apparent, however, that the metal layer constituting conductive layer 23 may be replaced by a highly doped semiconductor layer or a P+ layer. In this case, a P+ layer as the layer 23 and the N+ regions 22 should be heavily doped, perferably at the impurity concentration more than $5 \times 10^{19}/cm^3$. This concentration will be needed to provide an electrical conduction due to tunneling effect between P+ layer 23 and N+ regions 22. Of course, it is possible to constitute the conductive layer 23 by using a heavily doped N+ semiconductor layer.

Figure 14:
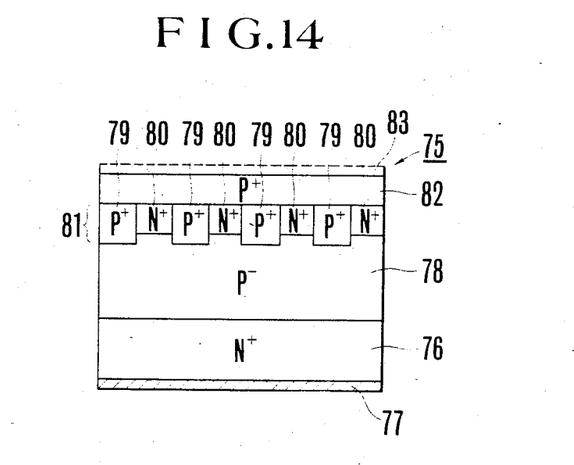
FIGS. 14 and 15 are cross-sectional views of P-N junction type diodes made in accordance with the teachings of the present invention.

FIG. 14 shows the cross-sectional view of the P-N junction diode, of which the conductive layer follows the modification as described above. In the figure, a reference numeral 75 represents the PN junction diode, which compises a N+ semiconductor layer 76 having the impurity concentration of $5 \times 10^{18}/cm^3$ and the thickness of about 300 microns; a metal electrode 77 is in contact with one surface of N+ layer 76; a P$^-$ semiconductor layer 78 which is formed on the other surface of N+ layer 76 so as to have the impurity concentration of $5\times 10^{15}/cm^3$ and the thickness of about 10 microns; a mosaic pattern layer 81 which is formed on P− layer 78 and consists of a plurality of P+ regions 79 and N− regions 80, P+ regions 79 having the impurity concentration of $1\times 10^{19}/cm^3$ and a 1 micron depth and N+ regions 80 having the impurity concentration of $2\times 10^{20}/cm^3$ and a 0.5 micron depth; and a P+ polycrystalline silicon layer 82 having electrode function overlies mosaic pattern layer 81, and has the impurity concentration of $3\times 10^{20}/cm^3$ and a thickness of about 2 microns.

With this construction, majority carriers (holes in this case) from the P− region 78 reach the polycrystalline silicon layer 182 through P+ regions 79 while minority carriers (electrons in this case) from P− region 78 reach the polycrystalline silicon layer 82 through N+ regions 80. Accordingly, the loss of the diode 75 decomes smaller than that of the prior art diode, the storage charge and recovery time constant are made also smaller, and the high speed operation of the diode is obtained.

It should be noted in FIG. 14 that a metal layer 83 such as an aluminum layer may be added to P+ polycrystalline silicon layer 82, if so required.

In the embodiment shown in FIGS. 3 and 4, N+ regions or Schottky barrier regions are utilized as means for passing minority carriers or electrons. Instead of this, however, the same effect may be obtained by providing regions, of which the conduction band energy level is lower than that of P+ regions which form the mosic pattern and are used as the passage for majority carriers or holes. In other words, the same effect and advantage obtained by previously described embodiments may be achieved by providing another mosaic pattern layer which consists of P− regions and P+ regions. In this case, it is natural that P− regions have a lower impurity concentration that P+ regions and they are arranged in the same fashion as in the other embodiments. The area ratio of a P− regions to P+ regions may vary between the values of 0.05 to 50.

Figure 15:
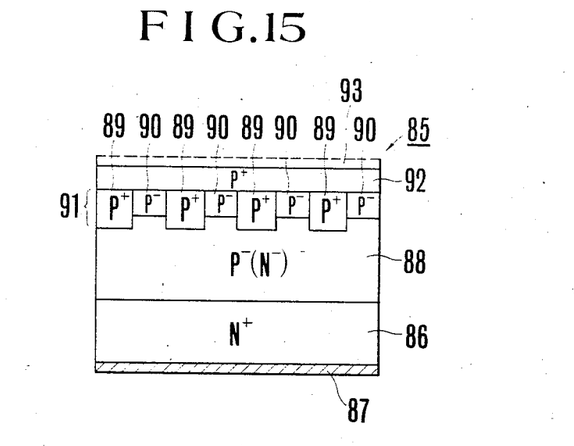

FIG. 15 shows the structure of the PN junction diode embodying the invention mentioned above. The diode 85 comprises an N+ semiconductor layer 86 which has the impurity concentration of $5\times 10^{18}/cm^3$ and the thickness of about 300 microns; a metal electrode 87 is in contact with one surface of layer 86; a P− (or N−) semiconductor layer 88 which is formed on the other surface of N+ layer 86, layer 88 having the impurity concentration of $5\times 10^{14}/cm^3$ and the thickness of about 15 microns; a mosaic pattern layer 91 which is formed on layer 88 by using a plurality of P+ regions 89 and P− regions 90 that are arranged side by side to contact with one another, the P+ regions having the impurity concentration of $1\times 10^{19}/cm^3$ and the thickness of about 1 micron and the P− regions 90 having the concentration of $1\times 10^{17}/cm^3$ and the thickness of 0.8 micron; and a P+ polycrystalline silicon layer 92 as an electrode which overlies mosaic pattern layer 91 and is doped at the impurity concentration of $3\times 10^{20}/cm^3$.

In this case, polycrystalline silicon layer 92 plays a role of absorbing, through a recombination process, electrons which have come into the P− region 90 from P− (or N−) layer 88. Therefore, the layer 92 has to be a polycrystalline silicon layer and not a single crystalline silicon layer, because the latter can not produce such effect as mentioned above. The polycrystalline silicon layer 92 can be replaced with a metal layer.

With the structure shown in FIG. 15, it is apparent that the same effect and advantage obtained by other embodiments can be attained. Further, it may be possible to form a metal electrode on P+ polycrystalline silicon layer 92, if it is necessary.

It is apparent that the present invention is not limited to the embodiments that have been discussed in the foregoing paragraphs and it may be modified variously. For example, P-type conductive layers or regions and N-type conductive layers or regions, which have been adopted in the embodiments above, are completely interchangeable. In this case, of course, majority carriers are changed from holes to electrons or vice versa and also minority carries are changed from electrons to holes or vice versa. As a further modification of the invention, it may be possible to use a heavily doped semiconductor layer such as a heavily doped polycrystalline silicon for the conductive layer in FIG. 3.

In the foregoing description, the present invention has been explained in terms of diodes and thyristors, but is is apparent that the present invention is also applicable to the other semiconductor devices such as bipolar transistors, field effect transistors and so forth.

What is claimed is:

1. An electrode structure for use in semiconductor devices comprising:
    a semiconductive layer;
    a polycrystalline silicon conductive layer disposed on one surface of said semiconductive layer, said polycrystalline silicon conductive layer having a high impurity concentration;
    first regions which intervene between said layers and define main passages for transmitting minority carriers from said semiconductive layer to said conductive layer; and
    second regions which intervene between said layers and define main passages for conveying majority carriers between said semiconductive layer and said conductive layer, said first and second regions being selectively formed on said semiconductive layer so as to be adjacent to one another and to lie parallel with respect to the current paths.

2. An electrode structure for use in semiconductor devices comprising:
    a semiconductor layer;
    a polycrystalline silicon conductive layer disposed on one surface of said semiconductive layer;
    first regions which intervene between said layers and define main passages for transmitting minority carriers from said semiconductive layer to said conductive layer; and
    second regions which intervene between said layers and define main passages for conveying majority carriers between said semiconductive layer and said conductive layer, said first and second regions being selectively formed on said semiconductive layer so as to be adjacent to one another and to lie parallel with respect to the current paths;
    said first regions, said second regions and said conductive layer being of the same conduction type, the impurity concentration of said first regions being lower than that of said second regions.

3. A structure according to claims 1 or 2, wherein said conductive layer has a metal layer overlying thereon.

* * * * *